(12) United States Patent
Kim et al.

(10) Patent No.: US 7,928,459 B2
(45) Date of Patent: Apr. 19, 2011

(54) LIGHT EMITTING DIODE PACKAGE INCLUDING THERMOELECTRIC ELEMENT

(75) Inventors: Bang Hyun Kim, Ansan (KR); Kwang Il Park, Ansan (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 305 days.

(21) Appl. No.: 12/280,442

(22) PCT Filed: Feb. 24, 2006

(86) PCT No.: PCT/KR2006/000661
§ 371 (c)(1),
(2), (4) Date: Aug. 22, 2008

(87) PCT Pub. No.: WO2007/097483
PCT Pub. Date: Aug. 30, 2007

(65) Prior Publication Data
US 2009/0065799 A1    Mar. 12, 2009

(51) Int. Cl.
*H01L 23/38* (2006.01)
*H01L 33/64* (2006.01)
(52) U.S. Cl. ............. 257/98; 257/99; 257/E23.082; 257/E33.075
(58) Field of Classification Search .......... 257/E23.082, 257/E33.075
See application file for complete search history.

(56) References Cited

U.S. PATENT DOCUMENTS

| | | | |
|---|---|---|---|
| 6,506,624 B2 | 1/2003 | Tatoh et al. | |
| 6,514,791 B2 | 2/2003 | Dautartas et al. | |
| 6,727,423 B2 | 4/2004 | Tauchi et al. | |
| 6,855,566 B2 | 2/2005 | Tatoh et al. | |
| 2004/0155251 A1* | 8/2004 | Abramov et al. | 257/81 |
| 2005/0008049 A1* | 1/2005 | Oomori et al. | 372/36 |

FOREIGN PATENT DOCUMENTS
JP    2004-303750    10/2004

* cited by examiner

*Primary Examiner* — Stephen W Smoot
(74) *Attorney, Agent, or Firm* — H.C. Park & Associates, PLC

(57) ABSTRACT

The present invention relates to a light emitting diode package, and provides a light emitting diode package employing a thermoelectric element therein. The light emitting diode package of the present invention is constructed such that the thermoelectric element is coupled to a housing or formed of a substrate itself so as to directly dissipate heat generated from a light emitting chip. Thus, the heat generated from the light emitting chip can be efficiently dissipated from the interior of the package to the outside, without an additional heat dissipation means. In addition, an external heat sink may be coupled to the thermoelectric element to more efficiently dissipate the heat from the light emitting chip.

12 Claims, 5 Drawing Sheets

[Fig. 1]
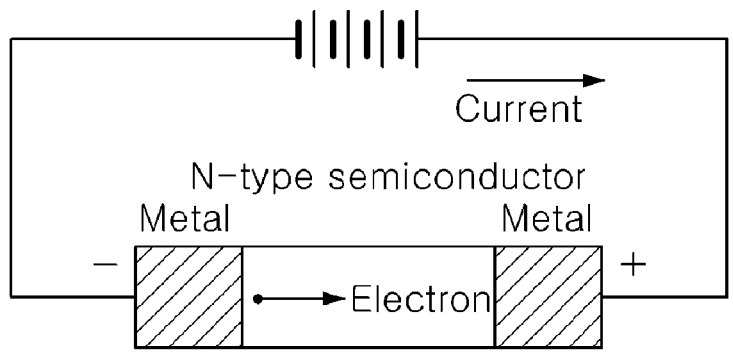
[Fig. 2]
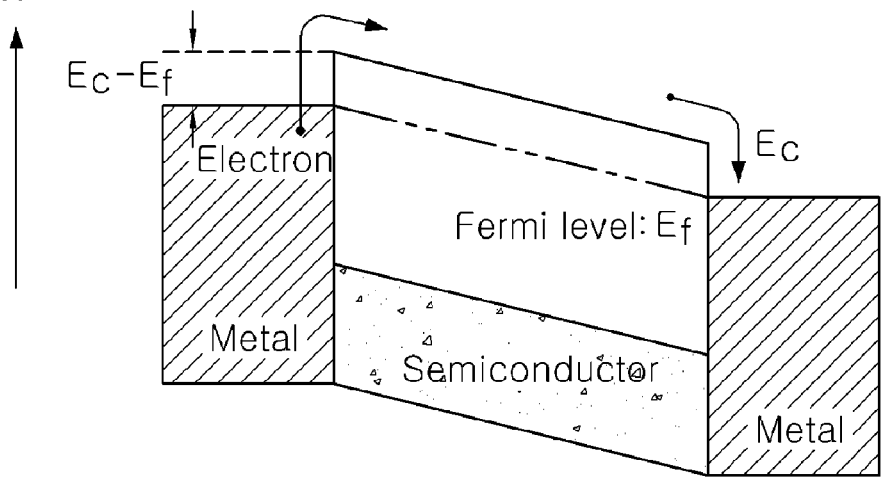
[Fig. 3]
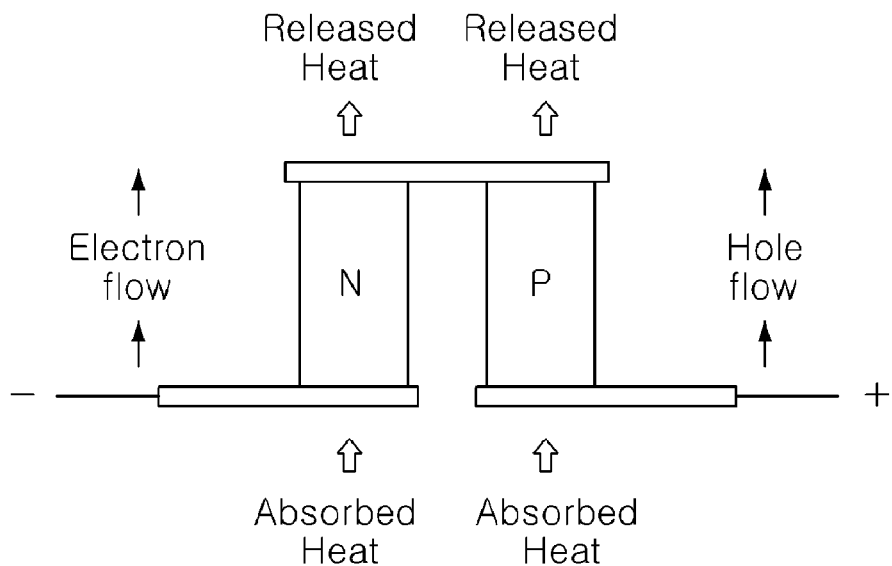

[Fig. 4]
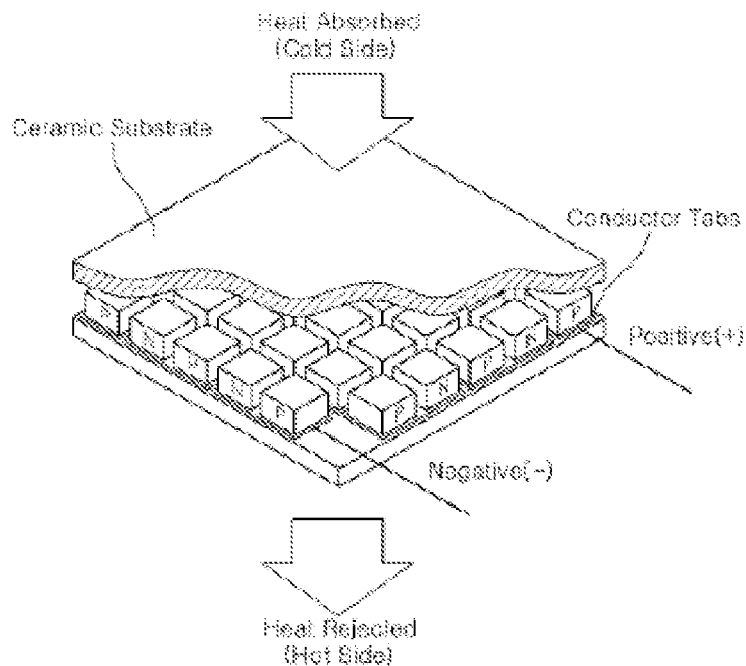
[Fig. 5]
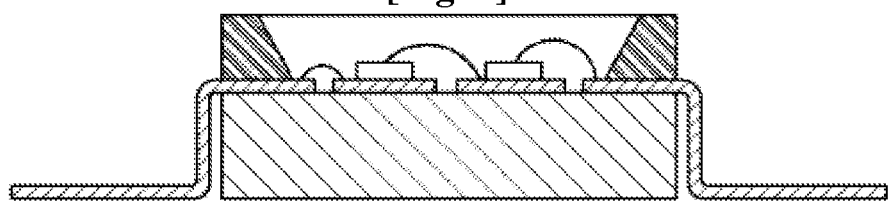
Related Art
[Fig. 6]
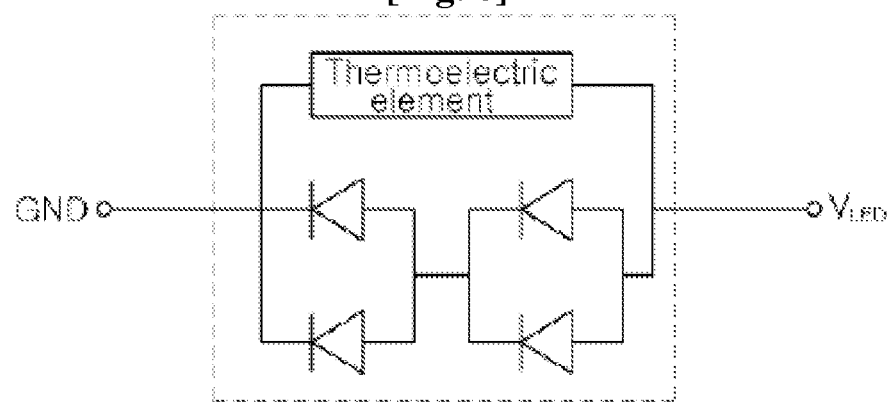

[Fig. 7]
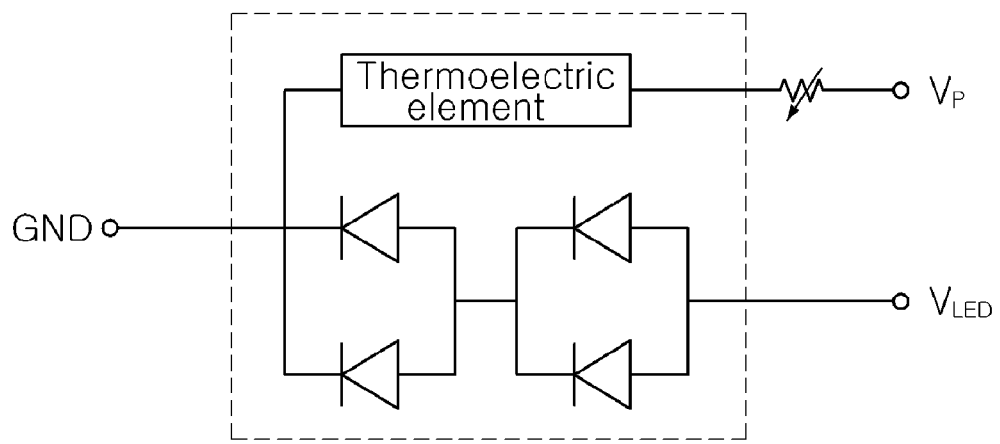
[Fig. 8]
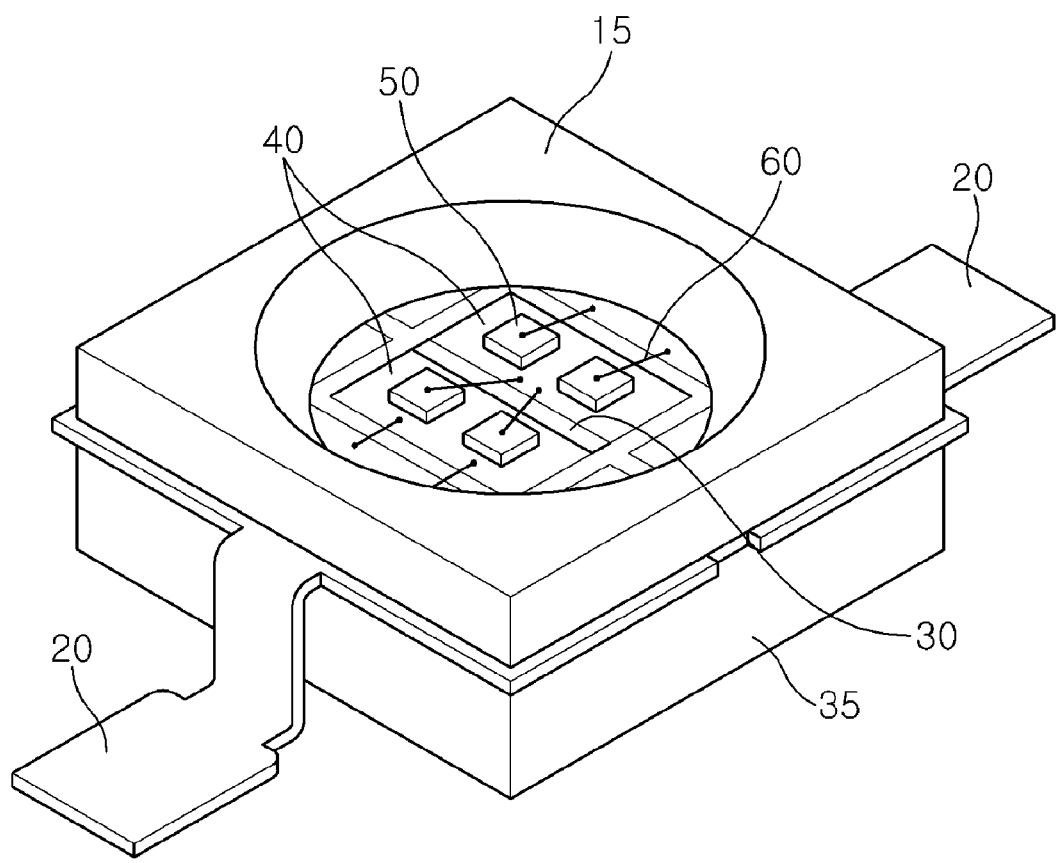

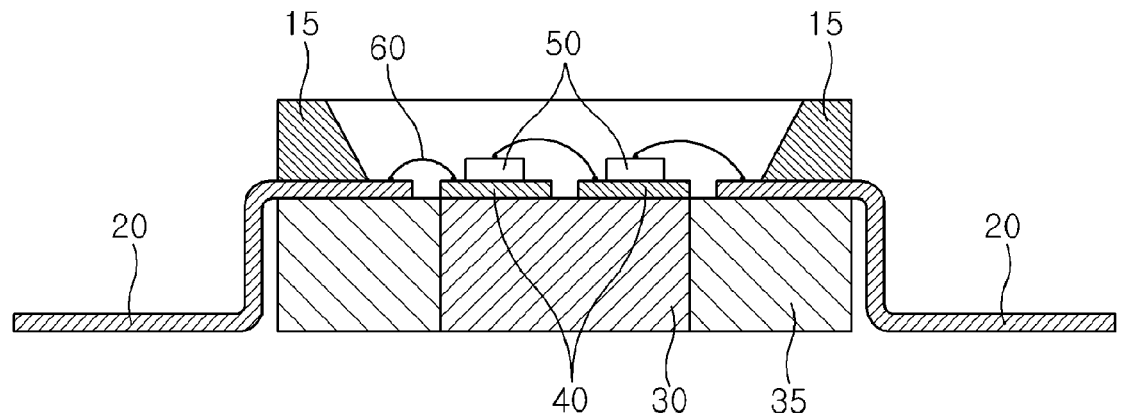
[Fig. 9]
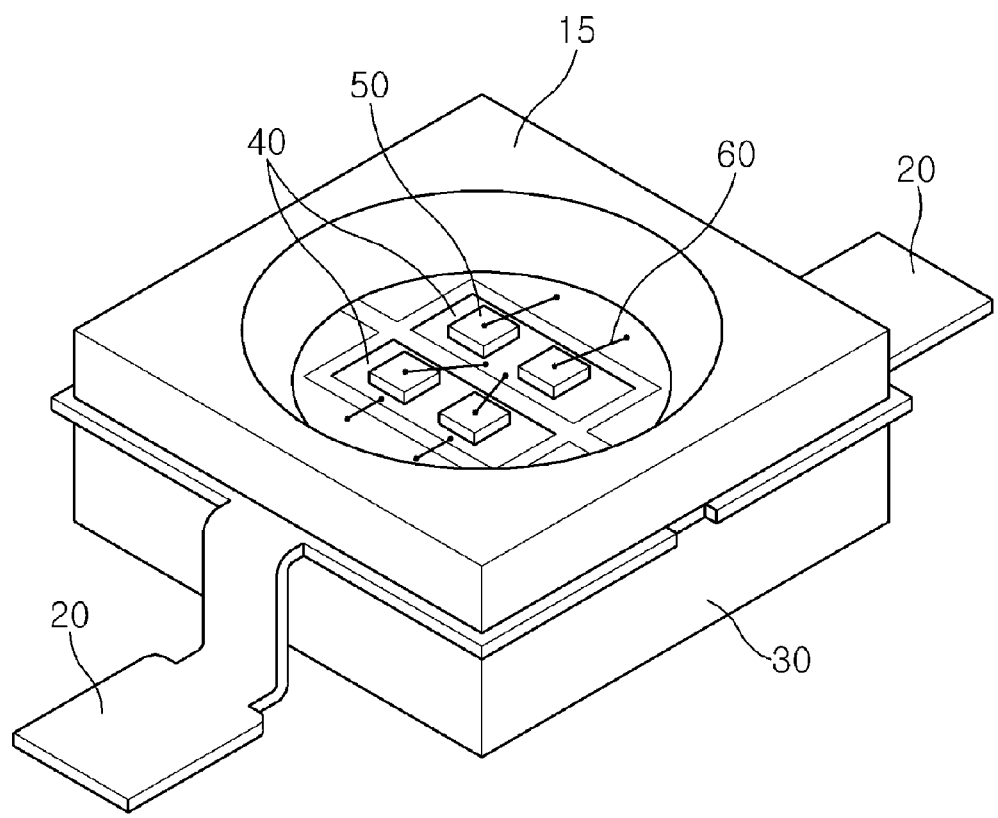
[Fig. 10]

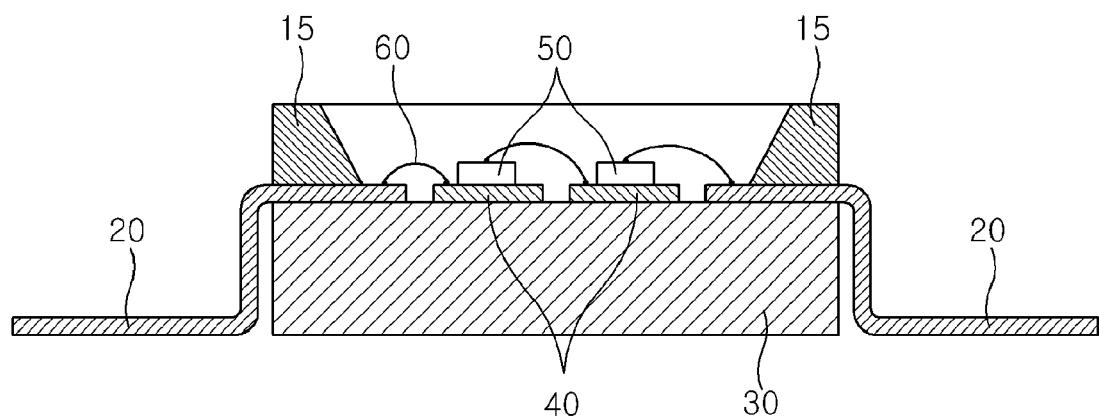
[Fig. 11]

LIGHT EMITTING DIODE PACKAGE INCLUDING THERMOELECTRIC ELEMENT

CROSS REFERENCE RELATED APPLICATION

This application is the National Stage of International Application No. PCT/KR2006/000661, filed Feb. 24, 2006, which is hereby incorporated by reference for all purposes as if fully set forth herein.

BACKGROUND OF THE INVENTION

1. Field of the Invention

The present invention relates to a light emitting diode package, and more particularly, to a light emitting diode package using a thermoelectric element.

2. Description of the Related Art

A light emitting diode (hereinafter, referred to as an "LED") refers to a semiconductor device having a p-n junction structure in which minority carriers (electrons or holes) are injected and light is emitted through recombination of the carriers. A variety of light emitting sources can be constructed by changing material of compound semiconductors such as GaAs, AlGaAs, GaN, InGaN and AlGaInP to provide light having various colors. The luminance of an LED is proportional to a current applied to a light emitting chip thereof, and the current applied to the light emitting chip is proportional to heat generated from the light emitting chip. Thus, a high current should be applied to increase the luminance of an LED. However, since the light emitting chip may be damaged due to heat generated therefrom, there is a problem in that the current cannot be increased infinitely. That is, as the current applied to the light emitting chip increases, the heat generated therefrom increases.

FIG. 5 is a sectional view of a conventional light emitting diode package that comprises a substrate, at least one light emitting chip mounted on the substrate, and a pair of lead frames. The substrate is formed of an insulating resin and has a reflective portion formed to surround the light emitting chip. Both electrodes of the light emitting chip are connected to the respective frames through conductive wires. The lead frames are electrically and thermally isolated from each other.

In the conventional light emitting diode package constructed as above, heat generated from the light emitting chip is dissipated through the lead frames. However, heat dissipation only through the lead frames of the light emitting diode package has a limitation on the amount of heat dissipation. Particularly, in case of recently developed high power light emitting diode packages, heat conduction only through lead frames is not sufficient for heat dissipation. That is, if a heat dissipation structure is not properly provided in the light emitting diode package, the heat generated from the light emitting chip cannot be efficiently dissipated, thereby causing a problem in that the service life of the light emitting chip is shortened.

SUMMARY OF THE INVENTION

The present invention is conceived to solve the aforementioned problems in the prior art. An object of the present invention is to provide a light emitting diode package, wherein a thermoelectric element is employed to efficiently dissipate heat generated from a light emitting chip to the outside, thereby extending the service life of the light emitting chip and thus improving the function of the light emitting diode.

To achieve the object, the present invention provides a light emitting diode package comprising a thermoelectric element and at least one light emitting chip mounted on the thermoelectric element. Further, the present invention provides a light emitting diode package comprising a housing; a thermoelectric element coupled to the housing; and at least one light emitting chip mounted on the thermoelectric element. The thermoelectric element may include a heat absorption section with the light emitting chip mounted thereon; a heat dissipation section parallel to the heat absorption section; and a plurality of thermoelectric semiconductors disposed between the heat absorption section and the heat dissipation section.

The light emitting diode package of the present invention may further comprise a reflective section provided around the light emitting chip.

The light emitting diode package of the present invention may further comprise a heat sink coupled to the thermoelectric element.

BRIEF DESCRIPTION OF THE DRAWINGS

The above and other objects, features and advantages of the present invention will become apparent from the following description of preferred embodiments given in conjunction with the accompanying drawings, in which:

FIG. 1 is a schematic diagram explaining the principle of a thermoelectric element;

FIG. 2 is a schematic diagram showing exothermic and endothermic reactions according to the energy level of the thermoelectric element;

FIG. 3 is a schematic diagram showing the basic connection of the thermoelectric element;

FIG. 4 is a schematic diagram showing the internal structure of a thermoelectric element according to an embodiment of the present invention;

FIG. 5 is a sectional view of a conventional light emitting diode package;

FIGS. 6 and 7 are circuit diagrams showing internal circuitry of a light emitting diode package according to the present invention;

FIG. 8 is a perspective view of a light emitting diode package according to a first embodiment of the present invention;

FIG. 9 is a sectional view of the light emitting diode package according to the first embodiment of the present invention;

FIG. 10 is a perspective view of a light emitting diode package according to a second embodiment of the present invention; and FIG. 11 is a sectional view of the light emitting diode package according to the second embodiment of the present invention.

DETAILED DESCRIPTION OF THE ILLUSTRATED EMBODIMENTS

Hereinafter, preferred embodiments of the present invention will be described in detail with reference to the accompanying drawings. However, the present invention is not limited to the embodiments but may be implemented into different forms. These embodiments are provided only for illustrative purposes and for full understanding of the scope of the present invention by those skilled in the art. Throughout the drawings, like elements are designated by like reference numerals.

FIGS. 1 and 2 are views specifically illustrating the thermoelectric effect. As shown in FIG. 1, a semiconductor, for example a semiconductor doped with n-type impurities, is bonded between identical metals and one of the metals is connected to a positive electrode of a power source and the other of the metals is connected to a negative electrode of the power source. In this case, electrons in the n-type semiconductor move to one metal to the other, resulting in a flow of an electric current. Charge carriers flowing from the metal to the n-type semiconductor, i.e., electrons, are restricted to those having energy larger than a potential barrier $(E_c-E_f)/e[J/C]$, as shown in FIG. 2. Therefore, only electrons having a sum of $(E_c-E_f)$ and average kinetic energy $3k_BT/2$ of electrons at an absolute temperature T can flow into the n-type semiconductor region. Here, $E_c$ is the energy level of a conduction band of the n-type semiconductor and $E_f$ is the Fermi level of the n-type semiconductor, e is the quantity of charge of an electron, and $K_B$ is the Boltzmann constant. In an interface between one of the metals and the n-type semiconductor, when the charge carriers move from one of the metals into the n-type semiconductor, the charge carriers lose energy by E $(=E_c-E_f+3k_BT/2[J])$ so that the metal can be cooled. In contrast, in another interface between the other of the metals and the n-type semiconductor, when the charge carriers move from the n-type semiconductor into the other of the metals, the charge carriers gain energy by E $(=E_c-E_f+3K_BT/2[J])$ so that an exothermic reaction occurs in the other metal. If the polarities of the applied voltage are switched, reverse phenomena occur. Thus, heat can be moved by means of electrical energy. In this way, the phenomenon in which heat is generated or absorbed in a portion where two different metals are joined upon flow of an electric current through a junction of two different metals is called the Peltier effect.

A thermoelectric for use in the present invention is a Peltier element using the Peltier effect. Referring to FIG. 3, when a direct current is applied to n-type and p-type semiconductors, at a negatively charged contact point of metal and semiconductor, electrons having thermal energy absorbed from the surrounding move into the thermoelectric semiconductor, thereby causing an endothermic reaction. At a positively charged contact point, the electrons discharge thermal energy, thereby causing an exothermic reaction. A thermoelectric element is obtained by consecutively combining the elements each of which comprises metals and thermoelectric semiconductor as above, and can be constructed as illustrated in FIG. 4. Referring to the figures, the thermoelectric element employed in the present invention comprises a heat absorption section, a heat dissipation section parallel to the heat absorption section, and a plurality of thermoelectric semiconductors disposed therebetween. Here, when the heat absorption being cooled through such an endothermic reaction is provided inside an LED package, it is possible to further facilitate heat dissipation from a light emitting diode. FIGS. 6 and 7 are circuit diagrams showing internal circuitry of a light emitting diode package according to the present invention. A thermoelectric element is provided inside the LED package to efficiently dissipate heat generated from a light emitting chip. In FIG. 6, two terminals are provided in such a manner that $V_P$ and $V_{LED}$ are incorporated into a single terminal, thereby simultaneously supplying electric power to the light emitting chip and the thermoelectric element. Alternatively, as shown in FIG. 7, three or four terminals may be provided in such a manner that $V_P$ to be connected to the thermoelectric element is separately constructed. In this case, since $V_P$ for use in supplying electric power to the thermoelectric element is separated, the light emitting chip and the thermoelectric element can be driven independently. Thus, the efficiency of the thermoelectric element can be easily controlled through control of an electric current in external circuitry.

FIG. 8 is a perspective view of a light emitting diode package according to a first embodiment of the invention. In this embodiment, a thermoelectric element 30 is combined with a housing 35 in a typical LED package. Thus, the thermoelectric element 30 serves as a heat sink that directly dissipates heat generated from light emitting chips. FIG. 9 is a sectional view of the LED package according to this embodiment.

Referring to FIGS. 8 and 9, the light emitting diode package of the present invention comprises one or more light emitting chips 50 emitting desired light according to a voltage, a housing 35 made of a thermosetting resin and having a predetermined through-hole, and a thermoelectric element 30 engaged in the through-hole of the housing 35. In addition, the light emitting diode package further comprises lead frames 20 for use in inputting an external voltage at both sides of the housing 35, and wires 60 for electrical connection to the light emitting chips 50. The thermoelectric element 30 is electrically isolated. For electrical connection of the light emitting chips 50, electrodes 40 are formed at predetermined positions on a top surface of the thermoelectric element 30 and the light emitting chips 50 are mounted on the electrodes 40. Preferably, the electrodes 40 are made of a metallic material such as copper or aluminum with good conductivity and formed by means of a printing technique. In this embodiment, the electrodes 40 are coated to facilitate electrical connection and the mounting of the light emitting chips 50. Alternatively, the light emitting chips 50 may be mounted directly on the top surface of the thermoelectric element 30 and both electrodes of each of the light emitting chips are connected to the lead frames 20 at the both sides of the light emitting diode package with a pair of wires 60.

Meanwhile, wiring of the thermoelectric element 30 is not shown in FIGS. 8 and 9. Referring to the circuit diagram of FIG. 6, however, this embodiment provides a light emitting diode package with two terminals, wherein both electrodes of the thermoelectric element 30 are electrically connected to the lead frames 20 with additional wiring. This means that $V_P$ and $V_{LED}$ are connected in common to each other so as to simultaneously supply electric power to the light emitting chip 50 and the thermoelectric element 30. In addition, referring to the circuit diagram of FIG. 7, three or four lead frames 20 may be provided such that the light emitting chips 50 and the thermoelectric element 30 are driven independently.

The light emitting diode package further comprises a reflective section 15 on the housing 35 and the lead frame 20 for increasing the luminance of light emitted from the light emitting chips 50 and improving light-concentrating capacity. The reflective section 15 is formed to be recessed in the form of an inverted truncated cone of which an upper diameter is larger than at least a lower diameter, and a sloped region of the recess serves as a reflective mirror for reflecting light emitted from the light emitting chips 50. The reflective section 15 should be electrically insulated from the lead frames 20 provided at the lower portion and is made of an insulating thermosetting resin. In addition, a molding section is formed on the light emitting chips 50, using an epoxy resin.

FIG. 10 is a perspective view of a light emitting diode package according to a second embodiment of the present invention. In this embodiment, a thermoelectric element 30 is formed of a substrate itself such that the thermoelectric element 30 serves as a heat sink for directly dissipating heat generated from the light emitting chips 50. FIG. 11 is a sectional view of the LED package.

Referring to FIGS. 10 and 11, the light emitting diode package of the present invention comprises one or more light emitting chips 50 emitting desired light according to a voltage, and the thermoelectric element 30 with the light emitting chips mounted thereon. The light emitting diode package further comprises lead frames 20 for use in inputting an external voltage at both sides of a top surface of the housing 35, and wires 60 for electrical connection to the light emitting chips 50. The thermoelectric element 30 is electrically isolated. For electrical connection of the light emitting chips 50, electrodes 40 are formed at predetermined positions on the top surface of the thermoelectric element 30 and the light emitting chips 50 are mounted on the electrodes 40. Preferably, the electrodes 40 are made of a metallic material such as copper or aluminum with good conductivity and formed by means of a printing technique. In this embodiment, the electrodes 40 are coated to facilitate electrical connection and the mounting of the light emitting chips 50. Alternatively, the light emitting chips 50 may be mounted directly on the top surface of the thermoelectric element 30 and both electrodes of each of the light emitting chips are connected to the lead frames 20 at the both sides of the light emitting diode package with a pair of wires 60.

Meanwhile, wiring of the thermoelectric element 30 is not shown in FIGS. 10 and 11. Referring to the circuit diagram of FIG. 6, however, this embodiment provides a light emitting diode package with two terminals, wherein both electrodes of the thermoelectric element 30 are electrically connected to the lead frames 20 with additional wiring. This means that $V_P$ and $V_{LED}$ are connected in common to each other so as to simultaneously supply electric power to the light emitting chip 50 and the thermoelectric element 30. In addition, referring to the circuit diagram of FIG. 7, three or four lead frames 20 may be provided such that the light emitting chips 50 and the thermoelectric element 30 are driven independently.

The light emitting diode package further comprises a reflective section 15 on the thermoelectric element 30 and the lead frame 20 for increasing the luminance of light emitted from the light emitting chips 50 and improving light-concentrating capacity. The reflective section 15 is formed to be recessed in the form of an inverted truncated cone of which an upper diameter is larger than at least a lower diameter, and a sloped region of the recess serves as a reflective mirror for reflecting light emitted from the light emitting chips 50. The reflective section 15 should be electrically insulated from the lead frames 20 provided at the lower portion and is made of an insulating thermosetting resin. In addition, a molding section is formed on the light emitting chips 50, using an epoxy resin.

As described above, the thermoelectric element is employed as a heat sink by using the endothermic reaction of the thermoelectric element so that heat generated from the light emitting chips can be effectively dissipated to reduce stress caused by the heat generated from the LED.

In addition, as described above, the heat generated from the light emitting chips can be efficiently dissipated by applying of the thermoelectric element to the light emitting diode package. An external heat sink may be further combined thereto so as to more effectively improve the heat dissipation efficiency.

According to the present invention described above, there is provided a light emitting diode package employing a thermoelectric element. Thus, heat generated from a light emitting chip in the package can be efficiently dissipated to the outside without an additional external heat dissipation means.

In addition, a reflective section is provided outside the light emitting chip to increase the luminance of the light emitting diode, thereby improving the efficiency of the light emitting diode.

The light emitting diode package of the present invention is not limited to the aforementioned embodiments but may be applied in various forms.

For example, although the embodiments described above include four light emitting chips, the number of the light emitting chips is not limited thereto but five or more light emitting chips may be mounted on the thermoelectric element.

What is claimed is:

1. A light emitting diode package, comprising:
    a thermoelectric element; and
    a light emitting chip mounted on the thermoelectric element,
    wherein the thermoelectric element and the light emitting chip are connected in parallel and are supplied with electric power through a single terminal.

2. The light emitting diode package as claimed in claim 1, wherein the thermoelectric element comprises a Peltier element.

3. The light emitting diode package as claimed in claim 1, wherein the thermoelectric element includes:
    a heat absorption section with the light emitting chip mounted thereon;
    a heat dissipation section parallel to the heat absorption section; and
    a plurality of thermoelectric semiconductors disposed between the heat absorption section and the heat dissipation section.

4. The light emitting diode package as claimed in claim 1, further comprising a reflective section provided around the light emitting chip.

5. The light emitting diode package as claimed in claim 1, further comprising a heat sink coupled to the thermoelectric element.

6. A light emitting diode package, comprising:
    a housing;
    a thermoelectric element coupled to the housing; and
    a light emitting chip mounted on the thermoelectric element,
    wherein the thermoelectric element and the light emitting chip are connected in parallel and are supplied with electric power through a single terminal.

7. The light emitting diode package as claimed in claim 6, wherein the thermoelectric element comprises a Peltier element.

8. The light emitting diode package as claimed in claim 6, wherein the thermoelectric element includes:
    a heat absorption section with the light emitting chip mounted thereon;
    a heat dissipation section parallel to the heat absorption section; and
    a plurality of thermoelectric semiconductors disposed between the heat absorption section and the heat dissipation section.

9. The light emitting diode package as claimed in claim 6, further comprising a reflective section provided around the light emitting chip.

10. The light emitting diode package as claimed in claim 6, further comprising a heat sink coupled to the thermoelectric element.

11. The light emitting diode package as claimed in claim 6, wherein the thermoelectric element is disposed within the housing.

12. The light emitting diode package as claimed in claim 6, wherein the housing completely surrounds the thermoelectric element.

* * * * *